(12) United States Patent
Vanevenhoven et al.

(10) Patent No.: US 11,885,850 B2
(45) Date of Patent: Jan. 30, 2024

(54) GENERATOR FAILURE DETECTION METHOD

(71) Applicant: Hamilton Sundstrand Corporation, Charlotte, NC (US)

(72) Inventors: Jordan K. Vanevenhoven, Rockford, IL (US); Mykola Kravchenko, Madison, WI (US); John F. Defenbaugh, Rockford, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 37 days.

(21) Appl. No.: 17/521,728

(22) Filed: Nov. 8, 2021

(65) Prior Publication Data

US 2023/0142245 A1    May 11, 2023

(51) Int. Cl.
| | | |
|---|---|---|
| *G01R 31/327* | (2006.01) | |
| *G01R 19/165* | (2006.01) | |
| *G01R 31/00* | (2006.01) | |
| *G01R 31/34* | (2020.01) | |
| *H02K 21/02* | (2006.01) | |
| *H02K 21/14* | (2006.01) | |
| *H02P 9/30* | (2006.01) | |

(52) U.S. Cl.
CPC .......... *G01R 31/343* (2013.01); *H02K 21/02* (2013.01); *H02K 21/14* (2013.01); *H02P 9/305* (2013.01)

(58) Field of Classification Search
CPC ....... G01R 31/343; H02P 9/305; H02K 21/14; H02K 21/02
See application file for complete search history.

(56) References Cited

U.S. PATENT DOCUMENTS

| | | | |
|---|---|---|---|
| 3,534,228 A | 10/1970 | Hyvarinen et al. | |
| 5,453,901 A * | 9/1995 | Lackey | H02H 7/065 361/21 |
| 7,746,038 B2 | 6/2010 | Maddali et al. | |
| 7,996,163 B2 | 8/2011 | Bailey et al. | |
| 9,431,941 B1 | 8/2016 | Verma et al. | |
| 10,746,803 B2 | 8/2020 | Chai et al. | |
| 2009/0167256 A1* | 7/2009 | Maddali | H02H 7/065 322/36 |
| 2009/0167257 A1 | 7/2009 | Maddali et al. | |
| 2012/0182648 A1 | 7/2012 | Maddali et al. | |
| 2013/0033038 A1* | 2/2013 | Rozman | H02P 25/024 290/31 |

* cited by examiner

*Primary Examiner* — Alesa Allgood
(74) *Attorney, Agent, or Firm* — Locke Lord LLP; Joshua L. Jones; Gabrielle L. Gelozin

(57) ABSTRACT

In accordance with at least one aspect of this disclosure, a method can include measuring a voltage across a DC link of a generator system when a generator exciter is inactive and a generator permanent magnet is active, and detecting a short or open permanent magnet generator (SOPMG) fault condition in the generator system with a DC link monitor operatively connected to measure the voltage across the DC link.

20 Claims, 1 Drawing Sheet

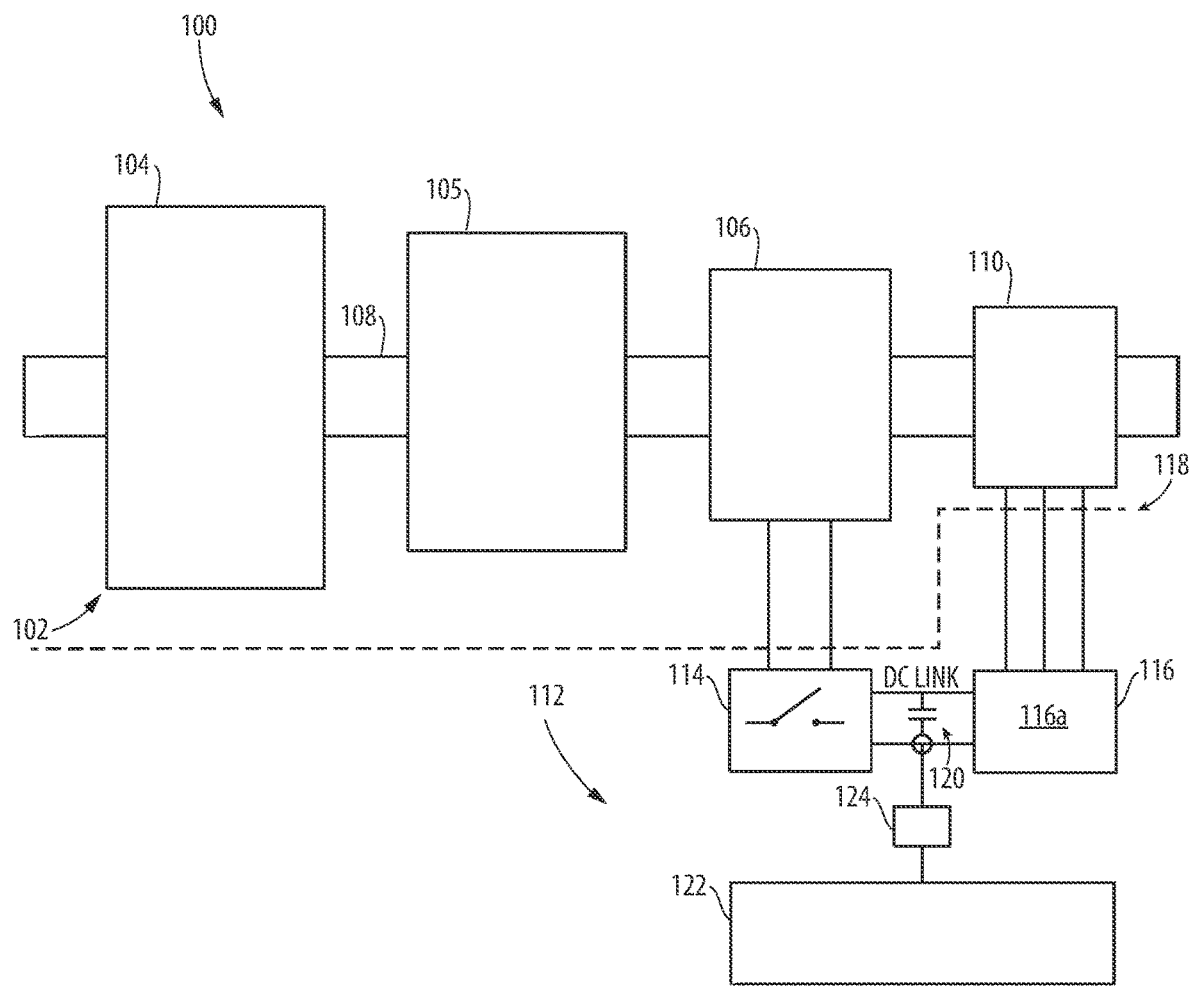

GENERATOR FAILURE DETECTION METHOD

TECHNICAL FIELD

The present disclosure relates to fault detection, and more particularly, fault detection in generator systems.

BACKGROUND

Typical systems and methods for detecting a short or open permanent magnet generator (SOPMG) fault condition may involve sensing the PMG phases and/or sense a ripple on a voltage that is rectified separate from the DC link. However, such conventional methods often require additional circuitry and board space, which, in certain applications may be limited.

There remains a need in the art for a simplified method to detect failures without the use of additional monitors. This disclosure provides a solution for this need.

SUMMARY

In accordance with at least one aspect of this disclosure, a method includes measuring a voltage across a DC link of a generator system when a generator exciter is inactive and a generator permanent magnet is active, and detecting a short or open permanent magnet generator (SOPMG) fault condition in the generator system with a DC link monitor operatively connected to measure the voltage across the DC link. Detecting the SOPMG fault condition in the generator system can include detecting abnormal ripple content associated with one or more DC link rectifier diodes on the DC link with the DC link monitor.

In embodiments, abnormal ripple content can include a higher ripple content on the DC link than ripple content observed on the DC link during normal operating conditions. In embodiments, abnormal ripple content can include ripple content on the DC link at a different frequency than ripple content observed on the DC link during normal operating conditions. In embodiments, detecting the SOPMG fault condition in the generator system can include isolating, using a filter, the abnormal ripple content at a frequency associated with a known SOPMG fault condition frequency to detect the SOPMG fault condition.

In certain embodiments, the method can include detecting a rectifier diode fault condition in the one or more DC link rectifier diodes with the DC link monitor. In certain such embodiments, detecting the rectifier diode fault condition in the one or more DC link rectifier diodes can include isolating, using a filter, the abnormal ripple content at a frequency associated with a known rectifier diode fault condition to detect the rectifier diode fault condition.

In embodiments, measuring the voltage across the DC link occurs during at least one of generator spin up and/or generator spin down. In embodiments, measuring the voltage across the DC link occurs during an initiated built in test (IBIT) and/or during a periodic test.

In accordance with at least one aspect of this disclosure, a non-transitory computer readable medium can have computer executable instructions configured to cause a computer to perform a method. The method can be as described hereinabove.

In accordance with at least one aspect of this disclosure, a generator system can include, a main generator stage, an exciter operatively connected to the main stage to provide excitation current to the main stage, a rotating rectifier stage operatively connected between the main generator stage and the exciter stage configured to rectify an alternating current output of the exciter stage into a direct current input to the main generator stage, a permanent magnet generator (PMG) operatively connected to the exciter, and a generator control unit.

In embodiments, the generator control unit can include an exciter drive electrically connected to the exciter, a rectifier diode bridge electrically connected to an output of the PMG, and a DC link electrically connected between the exciter drive and the rectifier diode bridge to supply excitation current from the PMG to the exciter through the exciter drive.

In embodiments, the generator system can further include a fault monitoring module operatively connected to the DC link. The fault monitoring module can have machine readable instructions configured to cause the module to measure a voltage across the DC link when the exciter drive is inactive and the PMG is generating current and detect a short or open permanent magnet generator (SOPMG) fault condition in the generator system at the DC link.

In embodiments, the machine readable instructions can be configured to cause the module to detect abnormal ripple content associated with one or more DC link rectifier diodes on the DC link. In embodiments, abnormal ripple content can include at least one of: a higher ripple content on the DC link than ripple content observed on the DC link during normal operating conditions, and/or a ripple content on the DC link at a different frequency than ripple content observed on the DC link during normal operating conditions.

In embodiments, the machine readable instructions can be configured to cause the module to isolate, using a filter, the abnormal ripple content at a frequency associated with a known SOPMG fault condition frequency to detect the SOPMG fault condition. In embodiments, the machine readable instructions can be configured to cause the module to detect a rectifier diode bridge fault condition in the one or more rectifier diodes in the rectifier diode bridge. In embodiments, the machine readable instructions can be configured to cause the module to isolate, using a filter, the abnormal ripple content at a frequency associated with a known rectifier diode fault condition to detect the rectifier diode fault condition.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain FIGURES, wherein:

FIG. 1 is a schematic diagram of a generator system in accordance with this disclosure, showing; a fault monitoring system operatively connected to the generator system.

DETAILED DESCRIPTION

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100. Other embodiments and/or aspects of this disclosure are described herein.

In accordance with at least one aspect of this disclosure, a generator system 100 can include a generator 102 having, a main generator stage 104, a rotating rectifier 105, an exciter 106 operatively connected (e.g., electrically and mechanically via a common shaft 108) to the main stage 104 and a permanent magnet generator (PMG) 110 operatively connected (e.g., electrically and mechanically via the common shaft 108) to the exciter 106. The rotating rectifier 105 can be operatively connected between the main generator stage 104 and the exciter stage 105 configured to rectify an alternating current output of the exciter 106 into a direct current input to the main generator stage 104. A generator control unit (GCU) 112 can be operatively connected to the generator 102 to control the generator 102. For example, the GCU 112 can include an exciter drive 114 electrically connected to the exciter 106, a rectifier diode bridge 116 (including one or more DC link rectifier diodes 116a) electrically connected to an output 118 of the PMG 110.

A DC link 120 can be electrically connected between the exciter drive 114 and the rectifier diode bridge 116 to supply excitation current from the PMG 110 to the exciter 106 through the exciter drive 114. More specifically, the output 118 of the PMG 110 can be rectified by the rectifier diode bridge 116 into the DC link 120 to be used by the exciter drive 114 to provide excitation current to the exciter 106. The exciter drive 114 can have an inactive state and an active state, where in the inactive state, no excitation is provided to the exciter 106 from the DC link 120, and in the active state, excitation current is allowed to flow from the DC link 120 to the exciter 106.

The generator system 100 can also include a fault monitoring module 122 operatively connected to the DC link 120 to monitor voltages across the DC link 120. The fault monitoring module 122 can include machine readable instructions configured to cause the module 122 to measure the voltage across the DC link 120 when the exciter drive 114 is open (e.g., the exciter 106 is receiving no excitation from DC link 120) and when the PMG 110 is generating voltage (e.g., the PMG 110 is spinning). For example, measuring the voltage across the DC link 120 can occur during at least one of generator spin up, or generator spin down. In certain embodiments, measuring the voltage across the DC link 120 can occur during an initiated built in test. In certain embodiments, measuring the voltage across the DC link 120 can occur during a periodic test. Fault monitoring module 122 can include machine readable instructions configured to cause the module 122 detect a short or open permanent magnet generator (SOPMG) fault condition in the generator system 100 at the DC link 120.

In detecting a fault, the machine readable instructions can be configured to cause the module 122 to detect abnormal ripple content associated with an SOPMG condition and/or one or more DC link rectifier diodes 116a on the DC link 120. In embodiments, abnormal ripple content can be a higher ripple content on the DC link 120 than ripple content observed on the DC link 120 during normal operating conditions. In embodiments, abnormal ripple content can be ripple content on the DC link 120 that is at a different frequency than ripple content observed on the DC link 120 during normal operating conditions. As used herein, normal operating conditions can include the generator system 100 operating without faults and/or when the PMG 110 is spinning and the exciter drive 114 is inactive (e.g., during engine spin up or spin down), or when the PMG 110 is spinning and the exciter drive 114 is active (e.g., when the engine is running). When abnormal ripple is detected, the machine readable instructions can be configured to cause the module to isolate with a filter 124 (e.g., a bandpass filter), the abnormal ripple content at a frequency associated with a known SOPMG fault condition frequency to detect the SOPMG fault condition.

In certain embodiments, the machine readable instructions can also be configured to cause the module 122 to detect a rectifier diode bridge fault condition in the one or more rectifier diodes 116a in the rectifier diode bridge 116, either independently or in addition to an SOPMG fault condition. In certain such embodiments, the machine readable instructions can be configured to cause the module 120 to isolate, e.g., using filter 124, the abnormal ripple content at a frequency associated with a known rectifier diode fault condition to detect the rectifier diode fault condition.

In accordance with at least one aspect of this disclosure, a method, e.g., for detecting faults in a generator system 100, can include measuring a voltage across a DC link (e.g., DC link 120) of a generator system when a generator exciter (e.g., exciter 106) is inactive and a PMG (e.g., PMG 110) is active, and detecting at least one of a short or open permanent magnet generator (SOPMG) fault condition and/or a rectifier diode bridge fault condition in the generator system with a DC link monitor (e.g., module 122) operatively connected to measure the voltage across the DC link. A SOPMG fault condition or a DC link rectifier diode fault condition may result in degraded generator capability or reduced reliability, therefore detecting such faults can mitigate or prevent degraded operation and reliability of the generator system. In embodiments, the method can be performed in any suitable manner, for example in the manner described above as performed by module 122. In certain embodiments, a non-transitory computer readable medium can include computer executable instructions configured to cause a computer to perform the method as described herein.

Traditional methods for detecting a SOPMG fault condition may involve sensing the PMG phases or sense of a ripple on a voltage that is rectified separate from the DC link. However, such methods may require additional circuitry and board space, which may be limited, and the additional circuitry may not be able sense DC link rectifier diode failures. Traditional DC link monitors may not be able to detect the SOPMG fault conditions or rectifier diode faults due to content from the exciter drive switching pending the switching frequency, or due to variances in DC link voltage level based on PMG strength, input speed, or generator load. The fault detection module as described herein can be advantageous over traditional monitors because it can provide all of the desired functionality (e.g., DC link monitoring, diode bridge fault monitoring, and SOPMG fault monitoring) in a single monitor, which can reduce the amount of board space needed, reduce the total amount of connections within the generator system, and reduce weight.

In embodiments, to detect a SOPMG condition with the single fault detection module (e.g., module 122), when the generator excitation is not active, and the generator is spinning, the DC link voltage can be observed. For example, this may be done during generator spin up or spin down when the exciter is disabled but the PMG is spinning and producing a voltage on the DC link. Having the operational test for SOPMG faults configured and adapted to be performed when the PMG is spinning and the exciter drive is inactive allows the operational test to be integrated into normal engine cycle, being performed at spin up and/or spin down. In normal operation with no failures, certain ripple content associated with the DC link rectifier diodes can appear on the DC link. A SOPMG fault condition can result in high ripple content on the DC link and at a different frequency. In embodiments, a band pass filter can be used to isolate content at the frequency associated with an SOPMG to detect the condition. In embodiments, this same, or a similar method may also be used to detect DC link rectifier diode failures, because the monitor will be electrically downstream of the diode bridge. In embodiments, the fault monitoring module can additionally serve as a filter in addition to a fault detection system, providing added functionality to the system.

As will be appreciated by those skilled in the art, aspects of the present disclosure may be embodied as a system, method or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the apparatus and methods of the subject disclosure have been shown and described, those skilled in the art will readily appreciate that changes and/or modifications may be made thereto without departing from the scope of the subject disclosure.

What is claimed is:

1. A method, comprising:
measuring a voltage across a DC link of a generator system when a generator exciter is inactive such that no excitation current is provided to the generator exciter and a permanent magnet generator (PMG) is active such that the permanent magnet generator is spinning; and
detecting a short or open permanent magnet generator (SOPMG) fault condition in the generator system based on the measured voltage across the DC link, wherein the measuring and the determining are performed by a DC link monitor operatively connected to measure the voltage across the DC link.

2. The method as recited in claim 1, wherein detecting the SOPMG fault condition in the generator system includes detecting abnormal ripple content associated with one or more DC link rectifier diodes on the DC link with the DC link monitor.

3. The method as recited in claim 2, wherein abnormal ripple content includes a higher ripple content on the DC link than ripple content observed on the DC link during normal operating conditions.

4. The method as recited in claim 2, wherein abnormal ripple content includes ripple content on the DC link at a different frequency than ripple content observed on the DC link during normal operating conditions.

5. The method as recited in claim 4, wherein detecting the SOPMG fault condition in the generator system includes isolating, using a filter, the abnormal ripple content at a frequency associated with a known SOPMG fault condition frequency to detect the SOPMG fault condition.

6. The method as recited in claim 2, further comprising detecting a rectifier diode fault condition in the one or more DC link rectifier diodes with the DC link monitor wherein the rectifier diode fault condition includes a short circuit in at least one diode of the DC link rectifier diodes or an open circuit in the in at least one diode of the DC link rectifier diodes.

7. The method as recited in claim 6, wherein detecting the rectifier diode fault condition in the one or more DC link rectifier diodes includes isolating, using a filter, the abnormal ripple content at a frequency associated with a known rectifier diode fault condition to detect the rectifier diode fault condition.

8. The method as recited in claim 1, wherein measuring the voltage across the DC link occurs during at least one of generator spin up and/or generator spin down, and does not occur during normal generator operation where the PMG is spinning and the exciter drive is active.

9. The method as recited in claim 1, where measuring the voltage across the DC link occurs during an initiated built in test (IBIT) and/or a periodic test.

10. A non-transitory computer readable medium having computer executable instructions configured to cause a computer to perform a method, the method comprising:
measuring a voltage across a DC link of a generator system when a generator exciter is inactive such that no excitation current is provided to the generator exciter and a permanent magnet generator (PMG) is active such that the permanent magnet generator is spinning; and
detecting a short or open permanent magnet generator (SOPMG) fault condition in the generator system based on the measured voltage across the DC link, wherein the measuring and the determining are performed by a DC link monitor operatively connected to measure the voltage across the DC link.

11. The non-transitory computer readable medium as recited in claim 10, wherein detecting the SOPMG fault condition in the generator system includes detecting abnormal ripple content associated with one or more DC link rectifier diodes on the DC link with the DC link monitor.

12. The non-transitory computer readable medium as recited in claim 11, wherein abnormal ripple content includes at least one of: a higher ripple content on the DC link than ripple content observed on the DC link during normal operating conditions, and/or a ripple content on the DC link at a different frequency than ripple content observed on the DC link during normal operating conditions.

13. The non-transitory computer readable medium as recited in claim 12, wherein detecting the SOPMG fault condition in the generator system includes isolating, using a filter, the abnormal ripple content at a frequency associated with a known SOPMG fault condition frequency to detect the SOPMG fault condition.

14. The non-transitory computer readable medium as recited in claim 11, further comprising detecting a rectifier diode fault condition in the one or more DC link rectifier diodes with the DC link monitor, wherein detecting the rectifier diode fault condition in the in the one or more DC link rectifier diodes includes isolating, using a filter, the abnormal ripple content at a frequency associated with a known rectifier diode fault condition to detect the fault condition.

15. A generator system, comprising a main generator stage;
   an exciter operatively connected to the main stage;
   a rotating rectifier stage operatively connected between the main generator stage and the exciter stage configured to rectify a alternating current output of the exciter stage into a direct current input to the main generator stage;
   a permanent magnet generator (PMG) operatively connected to the exciter;
   a generator control unit, including:
      an exciter drive electrically connected to the exciter;
      a DC link rectifier diode bridge electrically connected to an output of the PMG; and
      a DC link electrically connected between the exciter drive and the DC link rectifier diode bridge to supply excitation current from the PMG to the exciter through the exciter drive; and
   a fault monitoring module operatively connected to the DC link, the fault monitoring module having machine readable instructions configured to cause a the module to:
      measure a voltage across the DC link when the exciter drive is inactive and the PMG is generating voltage; and
      detect a short or open permanent magnet generator (SOPMG) fault condition in the generator system at the DC link based on the measured voltage across the DC link,
   wherein the short or open permanent magnet generator (SOPMG) fault condition includes one or more of:
      a short circuit between the PMG and the DC link rectifier diode bridge;
      an open circuit between the PMG and the DC link rectifier diode bridge;
      an short circuit in at least one diode of the DC link rectifier diode bridge; and/or
      an open circuit in at least one diode of the DC link rectifier diode bridge.

16. The system as recited in claim 15, wherein the machine readable instructions are configured to cause the module to:
   detect abnormal ripple content associated with one or more DC link rectifier diodes on the DC link.

17. The system as recited in claim 16, wherein abnormal ripple content includes at least one of: a higher ripple content on the DC link than ripple content observed on the DC link during normal operating conditions, and/or a ripple content on the DC link at a different frequency than ripple content observed on the DC link during normal operating conditions.

18. The system as recited in claim 17, where the machine readable instructions are configured to cause the module to:
   isolate, using a filter, the abnormal ripple content at a frequency associated with a known SOPMG fault condition frequency to detect the SOPMG fault condition.

19. The system as recited in claim 15, wherein the machine readable instructions are configured to cause the module to:
   detect a rectifier diode bridge fault condition in the one or more rectifier diodes in the rectifier diode bridge.

20. The system as recited in claim 19, wherein the machine readable instructions are configured to cause the module to:
   isolate, using a filter, the abnormal ripple content at a frequency associated with a known rectifier diode fault condition to detect the rectifier diode fault condition.

* * * * *